(12) United States Patent
Nakayama et al.

(10) Patent No.: US 7,323,783 B2
(45) Date of Patent: Jan. 29, 2008

(54) ELECTRODE, METHOD FOR PRODUCING SAME AND SEMICONDUCTOR DEVICE USING SAME

(75) Inventors: Tatsuo Nakayama, Tokyo (JP); Hironobu Miyamoto, Tokyo (JP); Yuji Ando, Tokyo (JP); Takashi Inoue, Tokyo (JP); Yasuhiro Okamoto, Tokyo (JP); Masaaki Kuzuhara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/574,933

(22) PCT Filed: Dec. 6, 2004

(86) PCT No.: PCT/JP2004/018140

§ 371 (c)(1),
(2), (4) Date: Apr. 7, 2006

(87) PCT Pub. No.: WO2005/057641

PCT Pub. Date: Jun. 23, 2005

(65) Prior Publication Data

US 2007/0018316 A1    Jan. 25, 2007

(30) Foreign Application Priority Data

Dec. 8, 2003    (JP) .............................. 2003-409512

(51) Int. Cl.
*H01L 23/48*    (2006.01)
*H01L 21/44*    (2006.01)

(52) U.S. Cl. ............... 257/765; 257/768; 257/E23.159; 257/E21.161; 438/656; 438/660

(58) Field of Classification Search ................ 257/734, 257/765, 768–771, E23.159, E21.161; 438/656, 438/660, 686

See application file for complete search history.

(56) References Cited

U.S. PATENT DOCUMENTS

| 5,563,422 | A |  | 10/1996 | Nakamura et al. |
|---|---|---|---|---|
| 5,652,434 | A |  | 7/1997 | Nakamura et al. |
| 5,767,581 | A |  | 6/1998 | Nakamura et al. |
| 5,770,489 | A | * | 6/1998 | Onda ......................... 438/167 |

(Continued)

FOREIGN PATENT DOCUMENTS

JP    07-045867    2/1995

(Continued)

OTHER PUBLICATIONS

Ghandhi, S.K., VLSI Fabrication Principles, John Wiley & Sons, 1983, p. 437.*

(Continued)

*Primary Examiner*—T. N. Quach
(74) *Attorney, Agent, or Firm*—Foley & Lardner LLP

(57) ABSTRACT

There is provided a technology for obtaining an electrode having a low contact resistance and less surface roughness. There is provided an electrode comprising a semiconductor film 101, and a first metal layer 102 and a second metal layer 103 sequentially stacked in this order on the semiconductor film 101, characterized in that the first metal film 102 is formed of Al, and the second metal film 103 is formed of at least one metal selected from the group consisting of Nb, W, Fe, Hf, Re, Ta and Zr.

15 Claims, 6 Drawing Sheets

U.S. PATENT DOCUMENTS

| | | | |
|---|---|---|---|
| 5,877,558 A | 3/1999 | Nakamura et al. | |
| 6,011,281 A | 1/2000 | Nunokawa et al. | |
| 6,093,965 A | 7/2000 | Nakamura et al. | |
| 6,146,931 A | 11/2000 | Nunokawa et al. | |
| 6,204,512 B1 | 3/2001 | Nakamura et al. | |
| 6,507,041 B2 | 1/2003 | Nakamura et al. | |
| 6,610,995 B2 | 8/2003 | Nakamura et al. | |
| 6,998,690 B2 | 2/2006 | Nakamura et al. | |
| 7,078,733 B2 * | 7/2006 | Sotani et al. | 257/98 |
| 2004/0026701 A1 | 2/2004 | Murai et al. | |

FOREIGN PATENT DOCUMENTS

| | | |
|---|---|---|
| JP | 07-248204 | 9/1995 |
| JP | 09-219539 | 8/1997 |
| JP | 10-022494 | 1/1998 |
| JP | 11-162996 | 6/1999 |
| JP | 11-220168 | 8/1999 |
| JP | 11-330558 | 11/1999 |
| JP | 2000-164928 * | 6/2000 |
| JP | 2001-148533 | 5/2001 |
| JP | 2001-196574 | 7/2001 |
| JP | 2002-319593 | 10/2002 |
| JP | 2003-077862 | 3/2003 |

OTHER PUBLICATIONS

Kumar et al., "Thermally-Stable Low-Resistance Ti/Al/Mo/Au Multilayer Ohmic Contacts on $n$-CaN," Journal of Applied Physics, vol. 92, No. 3, Aug. 1, 2002, pp. 1712-1714.

* cited by examiner

ELECTRODE, METHOD FOR PRODUCING SAME AND SEMICONDUCTOR DEVICE USING SAME

TECHNICAL FIELD

The present invention relates to an electrode, a method for manufacturing the same, and a semiconductor device using the same.

BACKGROUND ART

In a conventional semiconductor device having an HJFET (hetero junction field effect transistor) of an AlGaN/GaN structure, in general, an electrode of a Ti/Al structure has been used as an ohmic electrode (see, for example, Patent Document 1).

However, in the electrode formed of the Ti/Al structure alone, if heat treatment is performed at a temperature greater than a melting point (660° C.) of Al to reduce the contact resistance of the electrode, the surface coating ratio of an electrode material to a semiconductor film decreases due to the surface tension of the molten Al. As a result, realization of a low contact resistance tends to be difficult.

To overcome this problem, it has been reported to use an electrode having a Ti/Al/Mo/Au structure where the surface of Al is coated with Mo (see, for example, Non-Patent Document 1). In the electrode having a Ti/Al/Mo/Au structure, since the coating ratio of a semiconductor film to an electrode material is not reduced even if a heat treatment is performed at a temperature of equal or greater than 800° C. exceeding the melting point of Al, the low resistance can be realized compared to the electrode having a Ti/Al structure.

Patent Document 1: Japanese Patent Laid-Open No. 7-248204

Non-Patent Document 1: Kumar et al., Journal of Applied Physics, Vol. 92, No. 3, p. 1712

DISCLOSURE OF THE INVENTION

Problems to be Solved by the Invention

However, when the electrode of a Ti/Al/Mo/Au structure is treated with heat at a temperature exceeding the melting point (about 660° C.) of Al, the surface coating ratio of an electrode material to a semiconductor film does not decrease; however, the surface of the electrode becomes rough. Therefore, when a semiconductor device having a fine electrode pattern is formed, characteristics desired for the semiconductor device when designed tend not to obtain as the interval between electrodes decreases. Thus, a further improvement has been desired.

It turns out that the roughness of the electrode surface becomes more apparent when the heat treatment is performed at a temperature exceeding 700° C.

The present invention was attained in view of the aforementioned problems and directed to provide a technology for obtaining an electrode having a low contact resistance and less surface roughness.

Means for Solving the Problems

According to the present invention, there is provided an electrode comprises at least a first metal and a second metal comprising; wherein the electrode is formed on a semiconductor film which formed on a substrate, and a first metal layer and a second metal layer sequentially formed on the semiconductor film in this order, and the electrode in ohmic contact with the semiconductor film with heat treatment at a temperature equal 40° C. or more greater than the melting point of Al; wherein a first metal material formed the first metal layer is comprised of Al, and a eutectic alloy formed of the first metal material and a second metal material forming the second metal film has a melting point equal or greater than the temperature of the heat treatment, and an alloy of the second metal material and Al starts to be formed at a temperature equal or greater than the melting point of Al.

According to the present invention, there is provided a method for manufacturing an electrode formed on a semiconductor film, comprising the steps of: forming a first metal film on the semiconductor film; forming a second metal film; and treating the first metal film and the first metal film with heat at a temperature 40° C. or more greater than the melting point of Al, characterized in that a eutectic alloy formed of the first metal film and the second metal film has a melting point greater than the temperature of the heat treatment step and the second metal material does not form an alloy with Al at a temperate equal or less than the melting point of Al.

ADVANTAGES OF THE INVENTION

According to the present invention, it is possible to realize an electrode formed on a semiconductor film, having a low contact resistance and an extremely flat surface.

DESCRIPTION OF SYMBOLS

Figure 1:
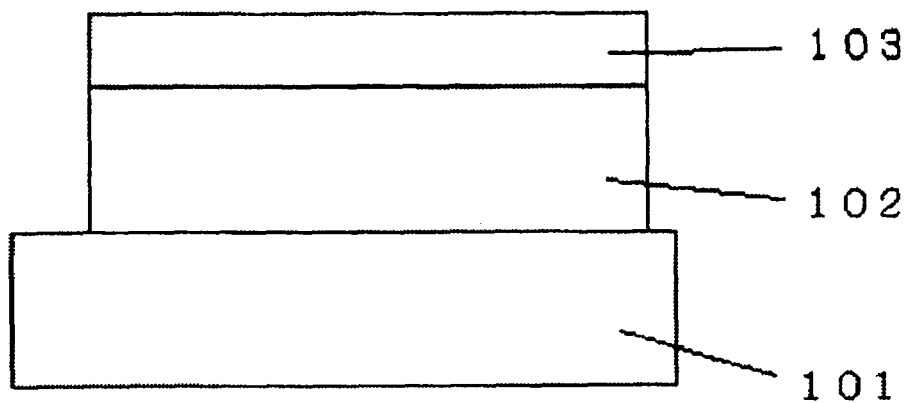
FIG. 1 is a sectional view partly showing the structure of an electrode according to an embodiment of the present invention.

101 Semiconductor film
102 First metal film
103 Second metal film
201 Semiconductor film
202 Intermediate metal film
203 First metal film
204 Second metal film
301 Semiconductor film
302 First metal film
303 Second metal film
304 Third metal film
401 Semiconductor film
402 Intermediate metal film
403 First metal film 404 Second metal film
405 Third metal film
501 Sic substrate
502 AlN buffer layer
503 GaN carrier migration
504 AlGaN carrier supply layer
505 Source electrode
506 Drain electrode
507 Gate electrode

BEST MODE FOR CARRYING OUT THE
INVENTION

The present inventors conducted studies with a view to attaining embodiments of the invention. The present inventors found that the rough surface of an electrode having a Ti/Al/Mo/Au structure (disclosed in Non-Patent Document 1) is caused by a eutectic alloy resulting from the reaction of Mo with molten Al. Then, the present inventors formed a first metal film on a semiconductor film and further a second metal film is formed thereon and thereafter the first metal film was treated with heat at a molten temperature not more than the melting point of the first metal film. At this time, they found, if the molten temperature is greater than the melting point of a eutectic alloy formed of the first metal film and the second metal film, an electrode having not only a low contact resistance but also en extremely flat surface can be obtained, without rarely developing a solid solution or a eutectic alloy of the first metal film and the second metal film at the time of the heat treatment. Based on the findings, they arrived at the present invention.

According to the preset invention, there is provided electrode comprises at least a first metal layer and a second metal layer comprising; wherein the electrode is formed on a semiconductor film which formed on a substrate, and the first metal layer and the second metal layer sequentially formed on the semiconductor film in this order, and the electrode in ohmic contact with the semiconductor film with heat treatment at a temperature equal 40° C. or more greater than the melting point of Al; wherein a first metal material formed the first metal layer is comprised of Al, and a eutectic alloy formed of the first metal material and a second metal material forming the second metal layer has a melting point equal or greater than the temperature of the heat treatment, and an alloy of the second metal material and Al starts to be formed at a temperature equal or greater than the melting point of Al.

An alloy of the second metal material and Al starts to be formed at a temperature is preferably equal or greater than the heat treatment temperature.

An alloy of the second metal material and Al starts to be formed at a temperature preferably equal or greater than the melting point of Al, and an alloy of the second metal material and Al starts to be formed at a temperature more preferably equal or greater than the heat treatment temperature.

This is because the melting point of a eutectic alloy formed of Ti and Al is as high as 1,400° C.; however Ti and Al tend to start forming of an alloy at a temperature of about 300° C., which is lower than the melting point of Al. Formation of such a metal material solid solution or a eutectic alloy initiates and progresses at a relatively low temperature at which Al does not yet melt. Thus, the metal material is not suitable as the second metal material of the present invention.

The initiation temperature for forming an alloy is preferable equal or greater than the melting point of Al, and more preferably, greater than the temperature of heat treatment.

The second metal layer is preferably comprises at least one metal selected from the group consisting of Nb, W, Fe, Hf, Re, Ta and Zr.

As the first metal layer, a metal capable of easily being in the ohmic contact with the semiconductor film and having a relatively low melting point is preferably used, and generally Al is employed.

Over the upper surface of the first metal layer comprises Al, the second metal layer is formed, which comprises a metal material that hardly develops into a eutectic alloy with Al even at a temperature of heat treatment equal or greater than the melting point of Al, in other words, which is made of a metal material that develops into a eutectic alloy with Al contained in a maximum content at a temperature greater than the temperature of heat treatment. Therefore, the first metal layer and the second metal layer are rarely developed into a solid solution or a eutectic alloy during the heat treatment. As a result, it is possible to effectively form an electrode having an extremely flat surface even if contact resistance is lowered by performing heat treatment at a high temperature.

According to the present invention, there is provided a semiconductor device having a semiconductor film and an electrode formed on the semiconductor film in which the electrode is identical to that mentioned above.

According to the present invention, since an electrode having the aforementioned structure is formed in the semiconductor device, the electrode attains en extremely flat surface simultaneously with a low contact resistance in the same manner as mentioned above. As a result, it is possible to effectively manufacture a semiconductor device having a fine electrode pattern more accurately formed.

In the foregoing, the structures of the present invention have been described. It is also effective to arbitrarily combine these structures as embodiments of the present invention. Furthermore, the embodiments of the present invention may be modified and arbitrarily applied to another category.

The embodiments of the present invention will be now described in more detail with the reference with the accompanying drawings, below. Note that like reference numerals are used to designate like structural elements in all drawings and any further explanation is omitted for brevity's sake.

EMBODIMENT 1

FIG. 1 is a sectional view of a structure of an electrode provided by this embodiment.

The electrode provided by the embodiment is obtained by forming, on a Group III nitride semiconductor film 101, a first metal film 102 and a second metal film 103, and is patterned by a method such as lift-off, followed by performing heat treatment at a temperature equal or greater than the melting point of Al.

As the Group III nitride semiconductor film 101 according to this embodiment, use may be comprised of a semiconductor film comprising GaN, AlN, InN and a mixture thereof as a main component. As the first metal film 120, a metal film comprised Al may be used. As the second metal film 103, it is preferable to choose a metal that forms a eutectic alloy with Al serving as a main component of the first metal film 102 and the melting point of the eutectic alloy is relatively greater than a temperature of a heat treatment for reducing contact resistance, thereby bringing Al into ohmic contact with the semiconductor film. If the melting point of the eutectic alloy comprises the metal and Al is greater than the temperature of the heat treatment, the metal rarely forms an alloy with Al when the heat treatment is performed at a temperature equal or greater than the melting point of Al.

A metal film may be preferably comprises at least one metal selected from the group comprising Nb, W, Fe, Hf, Re, Ta and Zr. Each of the metals is capable of forming a eutectic alloy with Al in a relatively low Al content and having a melting point or a temperature for causing a phase change, which is sufficiently greater than the temperature of the heat treatment.

In the specification of the present invention, the term "the metal film comprises a specific metal" may be a metal film comprises a specific metal alone or an alloy comprises a specific metal and another metal. Furthermore, the metal film may comprise impurities if it is a small amount.

In the electrode provided by the embodiment, since the surface of the first metal film comprised Al is covered with the second metal film comprises a metal rarely comprising a eutectic alloy with Al at a heat treatment temperature greater by 40° C. or more than the melting point of Al, the material for the second metal film rarely reacts with molten Al to form a eutectic alloy. Thus, an electrode having a low contact resistance and a flat surface can be obtained.

Figure 7:
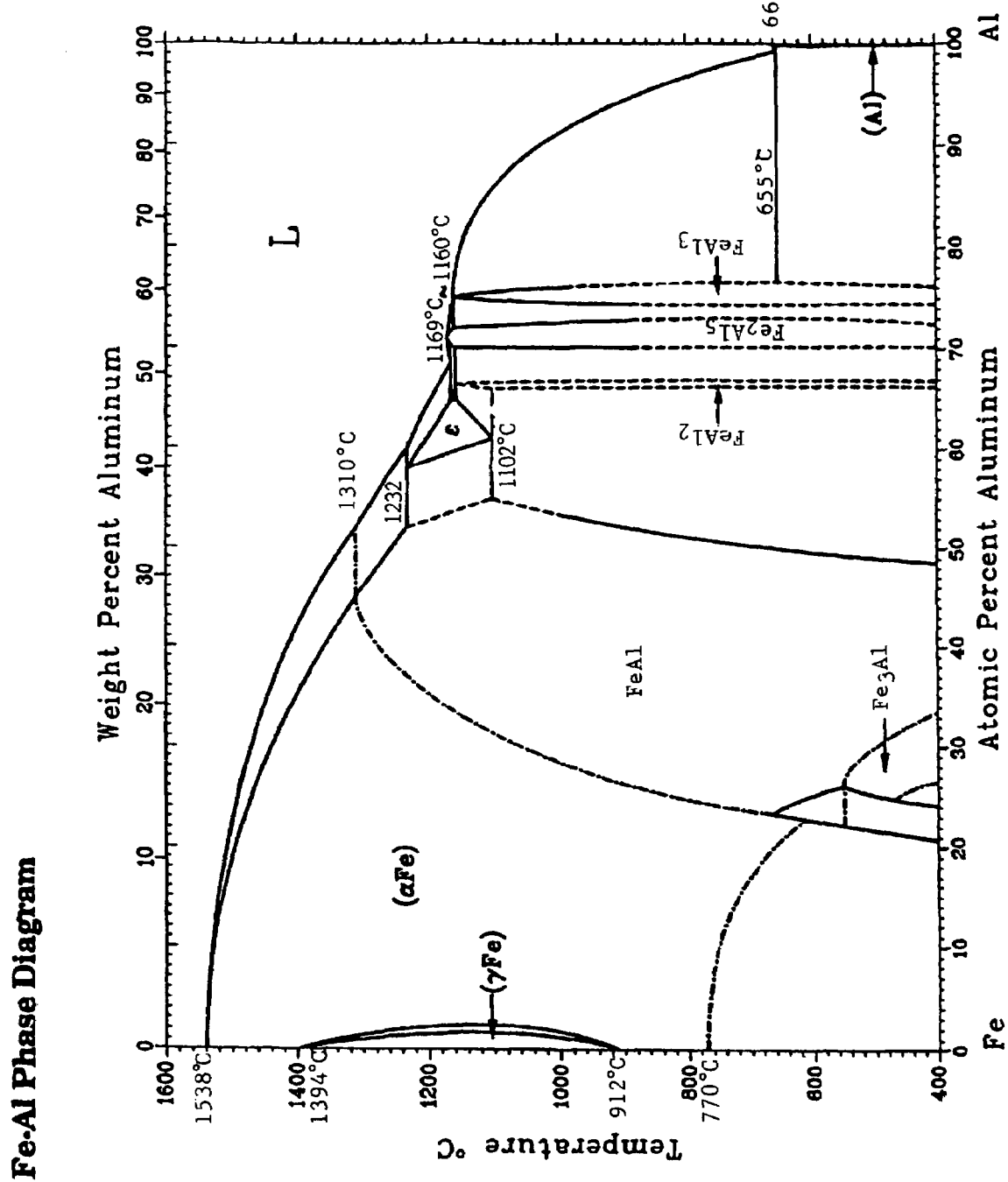
FIG. 7 is a phase diagram of an Fe—Al binary alloy.

FIG. 7 is a phase diagram of a well-known Fe—Al binary alloy.

For example, when a second metal film comprising Fe is used, what is a Fe—Al eutectic alloy having the highest Al content is FeAl$_3$. Since the melting point of this alloy or the temperature at which the alloy causes phase change is 1,160° C., Fe is hardly melted into molten Al solution when the heat treatment is performed at 900° C. In addition, the reaction toward an alloy having a lower Al content such as Fe$_2$Al$_5$ rarely proceeds. Therefore, penetration of Al into the second metal film formed of Fe hardly proceeds, meaning that Al rarely forms an alloy with Al.

To explain more specifically, if the melting point or phase-change temperature of the eutectic alloy having the highest Al content among the Al—Fe eutectic alloys initially formed at the interface between the molten Al and iron (Fe) is sufficiently greater than the temperature of the heat treatment for melting Al, the Al—Fe alloy thus formed serves as a barrier, the reaction between Fe and Al is conceivably not to proceed any more.

As a result, at the interface between the first metal film and the second metal film, an extremely thin layer (about 1 to 3 nm) of an alloy between Al comprising the first metal film and Fe comprising the second metal film is formed. The extremely thin Al—Fe alloy layer serves as a barrier layer for preventing Al constituting the first metal film from melting into the second metal film. As a result, when the second metal film formed of Fe is used, an electrode having an extremely flat surface can be obtained.

Figure 8:
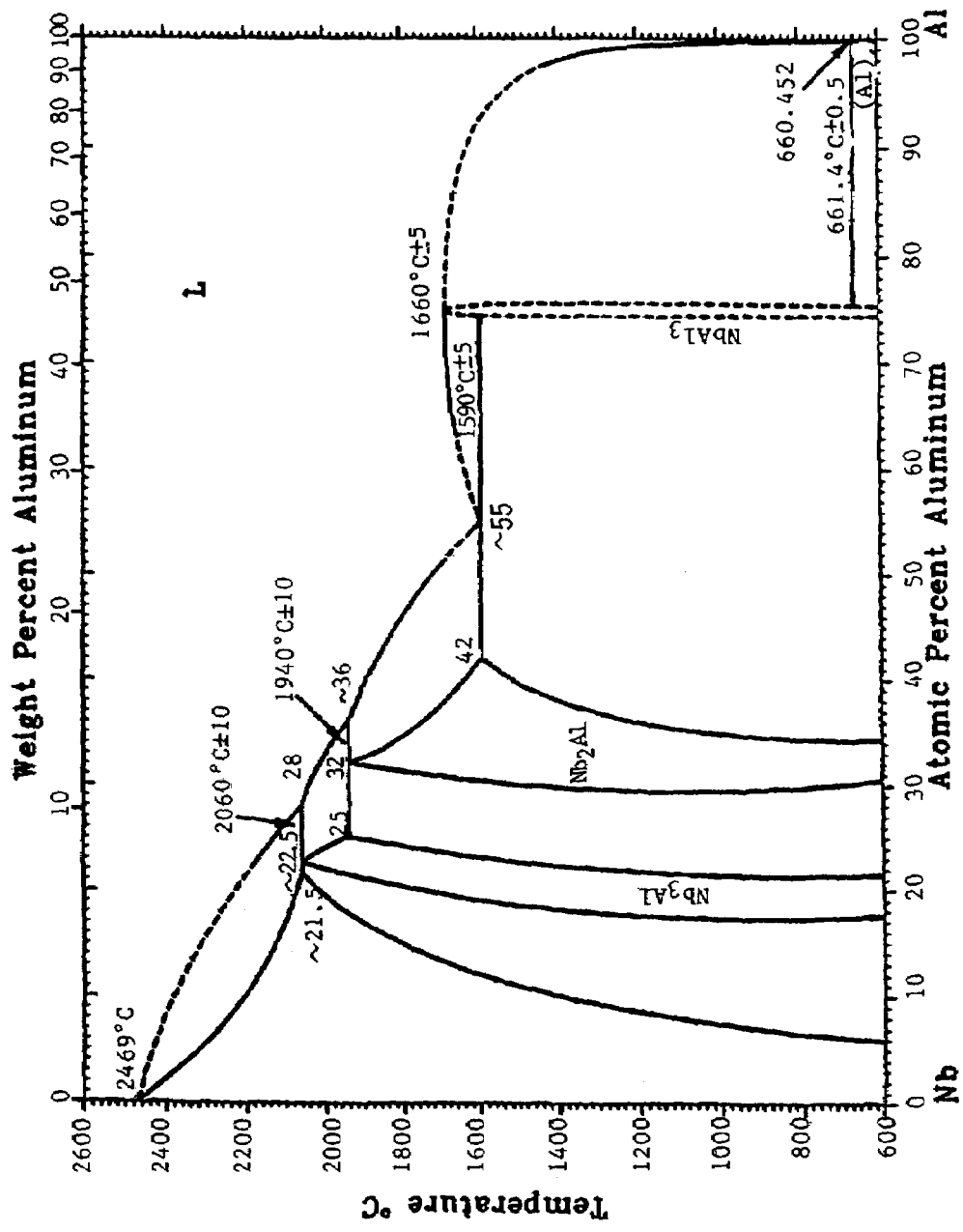
FIG. 8 is a phase diagram of an Nb—Al binary alloy.

FIG. 8 is a phase diagram of well-known Nb—Al binary alloy.

For another example, when a second metal film formed of niobium (Nb) is used, what is an Nb—Al eutectic alloy having the highest Al content is NbAl$_3$. The melting point or the phase-change temperature of the alloy is 1,660° C., which is sufficiently greater than the melting point of Al.

As a result, when Nb is used as the second metal film, an electrode having an extremely flat surface can be obtained since Nb functions in the same manner as in Fe.

Figure 6:
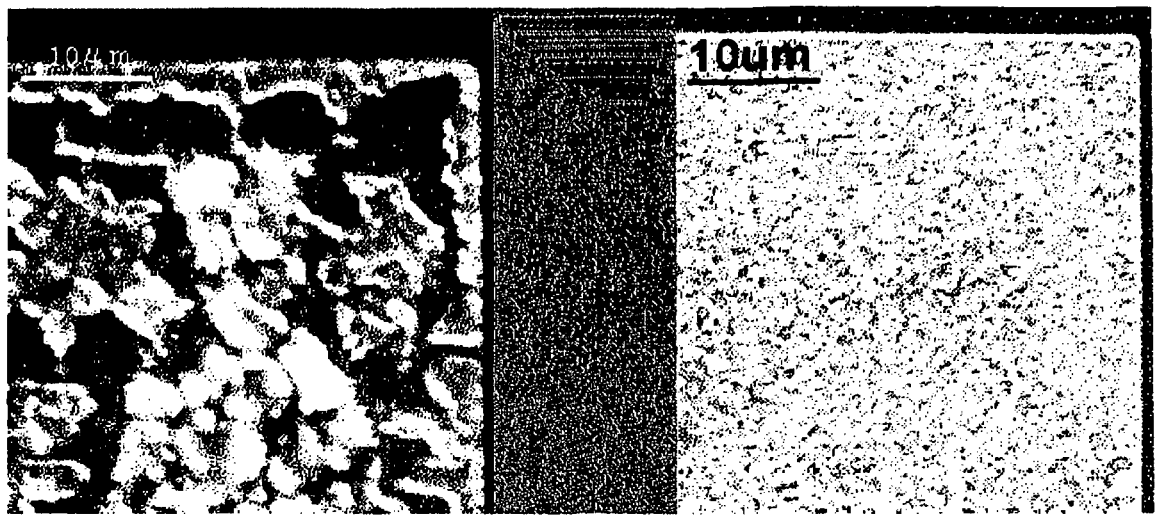
FIG. 6 shows photographs taken by an optical microscope showing the surface of an electrode provided by the present invention in comparison with that of an electrode provided by conventional technology.

Actually, when the second metal film formed of Nb is used, if the semiconductor film is an AlGaN semiconductor film, an electrode having a contact resistance as low as $1 \times 10^{-5}$ Ωcm$^2$ or less can be obtained as a result of heat treatment performed in a wide range of 830° C. to 1,000° C. (both inclusive). As is more specifically described later, an electrode having an extremely flat surface can be obtained as shown in FIG. 6.

Although the phase diagram is now shown, in the cases of W, Hf, Re, Ta and Zr, whose eutectic alloys with Al (at the highest Al content) has a melting point and phase-change temperature, which is sufficiently greater than the melting point of Al. Even if they are treated at a temperature of the melting point of Al or a heat treatment temperature of 800 to 950° C. (both inclusive), the formation of an alloy with Al did not proceed. Therefore, when a second metal film comprisise at least one metal selected from the group consisting of W, Hf, Re, Ta and Zr is used, an electrode having an extremely flat surface can be obtained since they functions in the same manner as mentioned above.

Al and a metal such as Nb, W, Fe, Hf, Re, Ta and Zr form an alloy layer at the interface thereof at a heat treatment temperature; however, the alloy layer does not develop into a solid solution or a eutectic alloy with Al and serves as a barrier for preventing formation of a solid solution or a eutectic alloy with Al.

In contrast, in a combination of Ti and Al, the melting point of a Ti—Al eutectic alloy is as high as 1,400° C.; however, the alloy formation tends to start at a temperature of about 300° C., which is lower than the melting point of Al. The alloy formation proceeds even at a temperature at which Al is not melted, while keeping a solid phase. Therefore, Ti is not suitably used as the second metal film. On the other hand, in combinations of Fe and Nb with Al, the alloy formation in a solid phase is rarely observed.

The melting point of Ti—Al eutectic alloy is as high as 1,400° C.; however, development of the eutectic alloy into a solid solution or a eutectic alloy proceeds (in other words, development into an alloy is initiated) at a temperature as low as 300° C., which is not greater than the melting point of the eutectic alloy.

Figure 9:
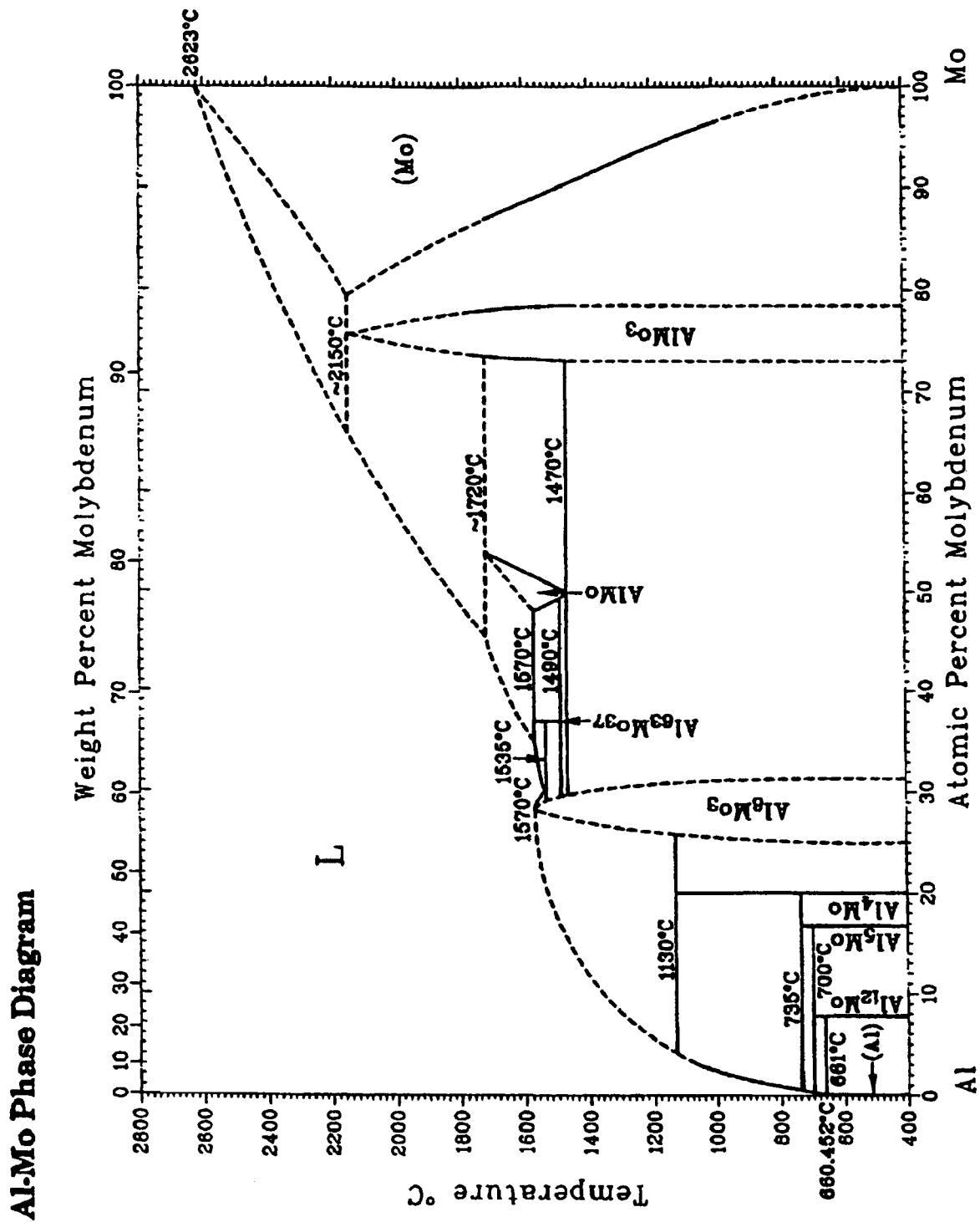
FIG. 9 is a phase diagram of an Al—Mo binary alloy.

FIG. 9 is a phase diagram of well-known Al—Mo binary alloy.

On the other hand, when a second metal film comprising molybdenum (Mo) is used, what is a eutectic Al—Mo alloy having the highest Al content is found to be Al$_{12}$Mo. Since the melting point of the alloy or the temperature at which the alloy causes a phase change into Al$_5$Mo is 700° C., even if Al$_{12}$Mo is once formed at the interface, it hardly serves as a barrier. When heat treatment is performed at 800° C., the reaction converts Al$_{12}$Mo through Al$_5$Mo into Al$_4$MO. As a result, Al molten solution is easily melted into the interior of Mo and the interior part of the second metal film formed of Mo develops (started development) into an alloy.

The electrode provided by the embodiment is preferably in an ohmic contact with the semiconductor film.

In the electrode, since the surface of a first metal film comprising Al is covered with a second metal film comprises a metal, which is hardly developing into a eutectic alloy even at a heat treatment temperature greater by 40° C. or more than the melting point of Al, an electrode in ohmic contact with the semiconductor film in which contact resistance is low, can be provided without decreasing a surface coating ratio of the electrode metal material to the semiconductor film at the time of heat treatment.

EMBODIMENT 2

Figure 2:
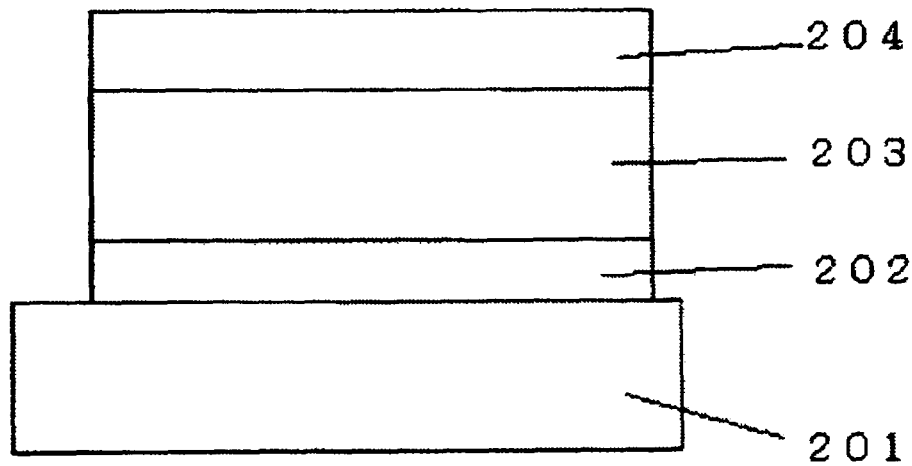
FIG. 2 is a sectional view partly showing the structure of an electrode according to an embodiment of the present invention.

FIG. 2 is a sectional view showing the structure of an electrode provided by this embodiment.

The electrode provided by the embodiment is obtained by forming, on a Group III nitride semiconductor film 201, an intermediate metal film 202 of a metal having a melting point greater than that of Al, a first metal film 203, and a second metal film 204, and by patterning a method such as lift-off, followed by performing heat treatment at a temperature equal or greater than the melting point of Al.

As the Group III nitride semiconductor film 201, use may be made of a semiconductor film comprising GaN, AlN, InN and a mixture thereof as a main component. As the intermediate metal film 202 comprises a metal having a melting point greater than that of Al. The metal comprises at least one metal selected from the group consisting of Ti, Nb, V, W, Ta, Re, Mo, Mn, Pt, Pd, Rh, Y and Zr. As the first metal film 203, for example, Al, may be used. As the second metal film 204, use may be comprise at least one metal selected from the group consisting of Nb, W, Fe, Hf, Re, Ta and Zr.

Alternatively, in the electrode provided by the embodiment, part or whole of the first metal film 203 may be formed of an alloy formed of the first metal material and the intermediate metal material (not shown in the figure) in place of providing the intermediate metal film.

When Ti is selected as the intermediate metal material, part or whole of the first metal film may sometimes develops into a eutectic alloy or solid solution alloy with the intermediate metal material depending upon the conditions such as heat treatment (herein sometimes referred to as "annealing") conditions (mainly temperature and time), and the thicknesses of the first metal layer and the intermediate metal layer before heat treatment. When an alloy is formed in this manner, the first metal material and the intermediate metal material, as a whole, tend to be in ohmic contact with the semiconductor film.

In either structure, thus the ohmic contact with the semiconductor film can be attained with a good reproducibility by constituting a region formed of the intermediate metal film or an alloy with the intermediate metal film in this manner.

In the embodiment, the intermediate metal material to be used in the electrode is preferably formed of at least one metal selected from the group consisting of Ti, Nb, V, W, Ta, Re, Mo, Mn, Pt, Pd, Rh, Y and Zr.

These metals each have a melting point greater than the melting point of Al and a characteristic of stably being in ohmic contact with the Group III nitride semiconductor film. Therefore, when the metal film formed of such an intermediate metal material is interposed between the Group III nitride semiconductor film and the metal film comprises the first metal material and treated with heat, further excellent ohmic contact with the semiconductor film can be attained.

More specifically, mention may be preferably made of a structure formed of the intermediate metal material comprises not less than one metal selected from the group consisting of Ti and Nb and the second metal material formed of Nb.

In the case of such a structure, since Ti and Nb each have a melting point greater than the melting point of Al, and Nb is a metal hardly developing into a eutectic alloy with Al at a heat treatment temperature equal or greater than the melting point of Al, more excellent ohmic contact can be attained by performing heat treatment after interposing such a metal film formed of the intermediate metal material between the semiconductor film and the metal film formed of the first metal material.

EMBODIMENT 3

Figure 3:
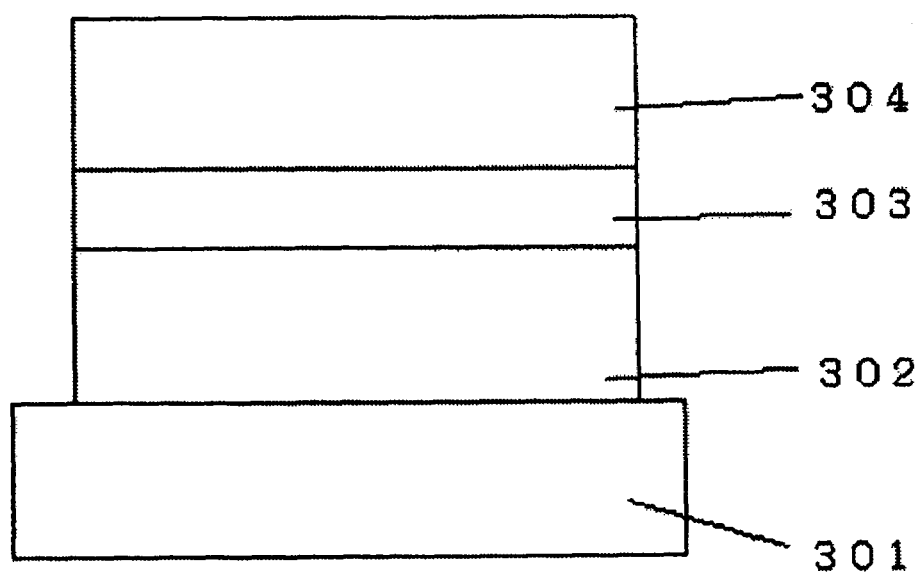
FIG. 3 is a sectional view partly showing the structure of an electrode according to an embodiment of the present invention.

FIG. 3 is a sectional view showing the structure of an electrode provided by this embodiment.

The electrode provided by the embodiment is obtained by forming, on a Group III nitride semiconductor film 301, a first metal film 302, a second metal film 303 and a third metal film 304 formed of a metal having a melting point greater than that of Al, and patterning the resultant structure by a method such as lift-off, followed by performing heat treatment at a temperature equal or greater than the melting point of Al.

As the Group III nitride semiconductor film 301, use may be made of a semiconductor film comprising GaN, AlN, InN and a mixture thereof as a main component. As the first metal film 302, a metal film formed of Al or an Al alloy may be used. As the second metal film 303, use may be made of at least one metal selected from the group consisting of Nb, W, Fe, Hf, Re, Ta and Zr. Similarly, as the third metal film 304 formed of a metal having a melting point greater than that of Al, use may be made of at least one metal selected from the group consisting of Cu, Ti, V, W, Ta, Re, Mo, Pt, Pd, Rh, Au and Zr, for example.

The surface of the second metal film can be protected by further providing the third metal film formed of a metal having a melting point greater than that of Al on the second metal film, thereby reducing resistance working in the parallel direction to the electrode surface.

The third metal material used herein is preferably an alloy formed of one metal or at least one metal selected from the group consisting of Cu, Ti, V, W, Ta, Re, Mo, Pt, Pd, Rh, Au and Zr.

These metals each have a melting point greater than that of Al and a nature of preventing oxidation of the second metal film. Therefore, they can protect the surface of the second metal film and reduce the resistance working in the parallel direction to the electrode surface.

More specifically, mention may be preferably made of a structure where the second metal material contains an Nb alloy and the third metal material is formed of Au.

This structure is preferable. This is because Nb, which is a metal hardly developing into a eutectic alloy with Al even at a heat treatment temperature equal or greater than the melting point of Al, rarely reacting with molten Al to form a eutectic alloy, with the result that an electrode having a low contact resistance and a flat surface can be obtained, and further because Au, which is a metal having a melting point greater than that of Al, can protect the surface of the second metal film and reduce the resistance in the parallel direction to the electrode surface.

EMBODIMENT 4

Figure 4:
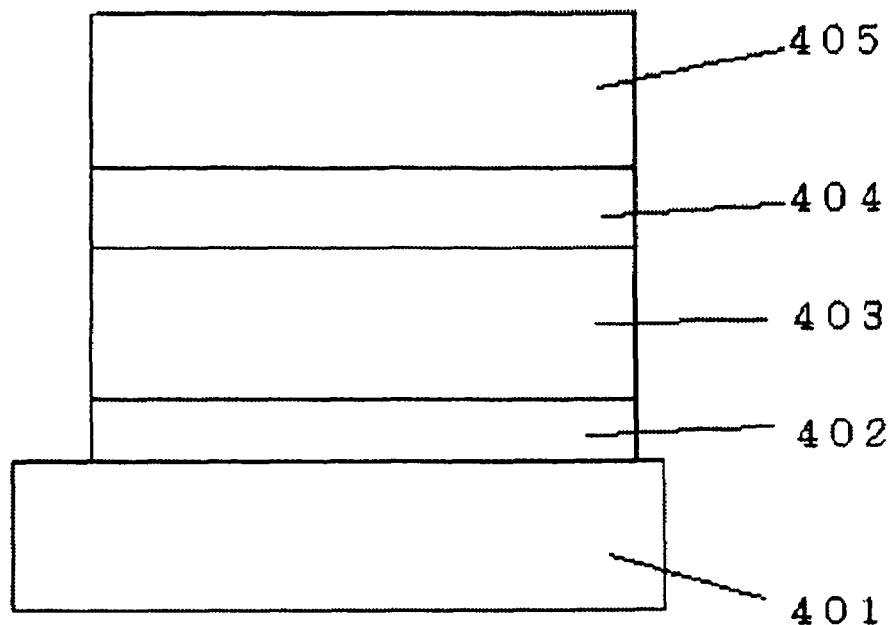
FIG. 4 is a sectional view partly showing the structure of an electrode according to an embodiment of the present invention.

FIG. 4 is a sectional view showing the structure of an electrode provided by this embodiment.

The electrode provided by the embodiment is obtained by forming, on a GaN-based semiconductor film 401, an intermediate metal film 402 comprising a metal having a melting point greater than that of Al, a first metal film 403, a second metal film 404, and a metal film 405 comprises a metal having a melting point greater than that of Al, and patterning by a method such as lift-off, followed by performing heat treatment at a temperature equal or greater than the melting point of Al.

As the GaN-based semiconductor film 401, use may comprise a semiconductor containing GaN, AlN, InN and a mixture thereof as a main component. As the intermediate metal film 402 comprises a metal having a melting point greater than that of Al, a metal film comprises at least one metal selected from the group consisting of Ti, Nb, V, W, Ta, Re, Mo, Mn, Pt, Pd, Rh and Zr. As the first metal film 403, a metal film formed of Al or an Al alloy may be used. As the second metal film 404, use may comprises at least one metal selected from the group consisting of Nb, W, Fe, Hf, Re, Ta and Zr. As the metal film 405 comprises a metal having a melting point greater than that of Al, use may comprises at least one metal selected from the group consisting of Cu, Ti, V, W, Ta, Re, Mo, Pt, Pd, Rh, Au and Zr.

This structure is preferable. This is because an electrode having a low contact resistance and a flat surface can be obtained and the ohmic contact with the semiconductor film can be attained with a good reproducibility and further because the surface of the second metal film can be protected and the resistance working in the parallel direction to the electrode surface can be reduced.

EMBODIMENT 5

Figure 5:
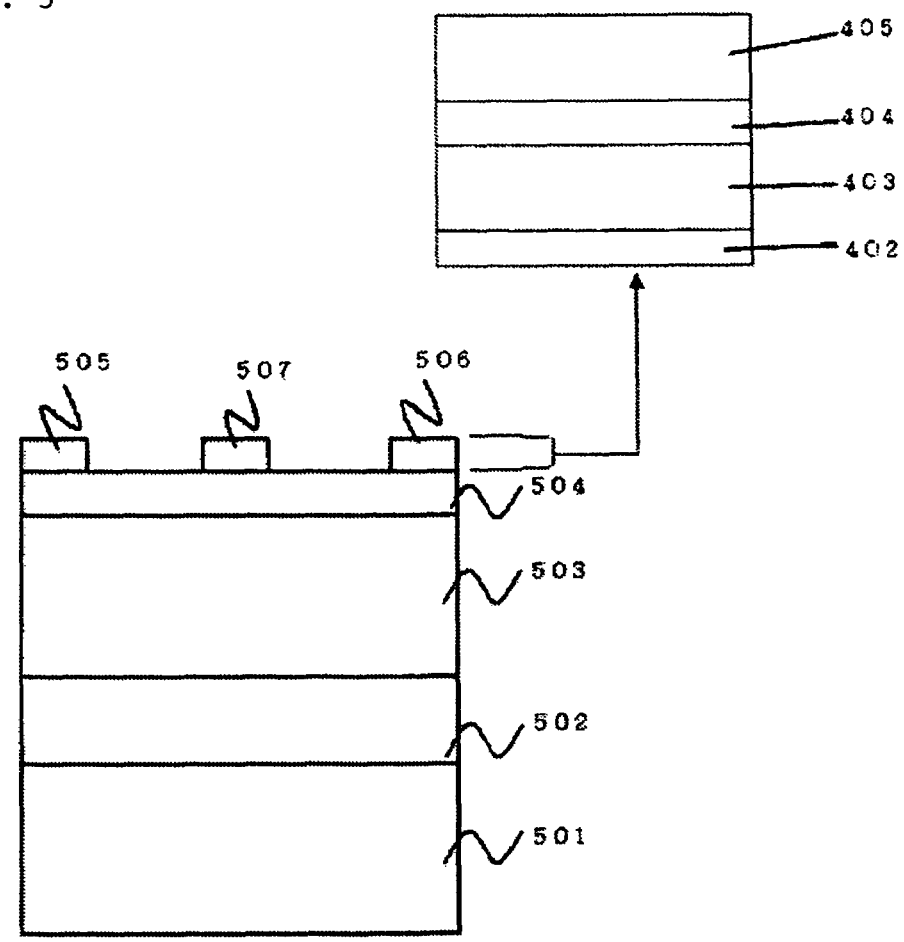
FIG. 5 is a sectional view partly showing the structure of a semiconductor device according to an embodiment of the present invention.

FIG. 5 is a sectional view showing the structure of a semiconductor device provided by this embodiment.

The semiconductor device provided by the embodiment has a semiconductor film (for example, AlGaN carrier supply layer 504) and an electrode formed on the semiconductor film (for example, a source electrode 505 and a drain electrode 506). The electrode mentioned above is employed as the electrode herein.

As described above, the semiconductor device provided by the invention has an electrode having a low contact resistance and a flat surface. Therefore in the semiconductor device of the invention, a fine electrode pattern can be easily and effectively formed. In forming a semiconductor device provided by the invention, an ohmic electrode and an alignment mark can be simultaneously formed. Thus, the number of manufacturing steps can be reduced and a fine pattern can be accurately formed.

The embodiments of the present invention have been described with reference to the drawings. Examples of the invention are described in these embodiments. Other than those mentioned above, various structures can be employed.

Examples of the Group III nitride semiconductor used in the aforementioned embodiments include, but not limited to, a material represented by the following formula (1):

$$In_xAl_yGa_{1-x-y}N \qquad (1)$$

wherein x and y are actual numbers satisfying the following conditions:

$0 \leq x \leq 1$, $0 \leq y \leq 1$, and $0 \leq x+y \leq 1$

More specifically, use may be made of a semiconductor film formed of a material such as AlN, GaN or AlGaN. Other than the materials represented by the formula (1), a semiconductor film formed of a so-called mixed crystal such as GaInNAs, GaNP, GaNPAs or AlNSiC can be used. These semiconductors are collectively called as Group III nitride semiconductors.

Such a Group III nitride semiconductor material has a sufficiently large bad gap and an interband transition is direct transition. The Group III nitride semiconductor material can be applied to a short wavelength light-emitting device. Furthermore, since the Group III nitride semiconductor material has a high saturation drift speed of electrons and can use a secondary carrier gas due to hetero conjunction, it can be applied to electron devices.

EXAMPLES

The present invention will be described in more detail with the reference to Examples; which should not be construed as limiting the present invention.

Example 1

FIG. 1 is a sectional view showing the structure of an electrode provided by this Example.

The electrode provided by the Example was formed by depositing an AlGaN film (composition ratio of Al: 0.3) as the Group III nitride semiconductor film 101, an Al film (film thickness: 60 nm) as the first metal film 102, and an Nb film (film thickness: 35 nm) as the second metal film 103 by sputtering, performing patterning by a method such as lift-off, and thereafter treating with heat at 900° C.

In such an electrode structure, since the surface of the Al film is covered with the Nb film, an electrode having a contact resistance as low as $5 \times 10^{-6}$ $\Omega cm^2$ or less can be obtained without reducing a coating ratio of the electrode material to the semiconductor film. At the same time, since the Nb film is rarely reacted with the Al film at 950° C., an extremely flat electrode surface can be obtained. It is possible to use an alignment mark for detecting a position by an optical sensor.

In the Example, an Al film was used as the first metal film. The first metal film may be a metal film formed of a mixture of Al and other metal(s). For example, Si or N may be added thereto. Note that as the content of Al decreases, the contact resistance tends to increase. Therefore, Al may be preferably used as a main component.

In the case where a film (35 nm) of an Nb—Fe alloy was formed of Nb and Fe as the second metal film by the electron gun deposition method, the same results as in the Nb film were obtained. As a result, it may be possible to use a metal film formed of an alloy of at least one metal selected from the group consisting of Nb, W, Fe, Hf, Re, Ta and Zr. Furthermore, the same results were obtained in the case of an Nb—Fe alloy containing Mo in a small amount (not more than 5% by weight).

Also in the Example, although the thickness of the first metal film 102 formed of Al was set at 60 nm and the Nb film 103 was set at 35 nm, the thicknesses of the Al film and Nb film can be set as desired. However, as the thickness of the Nb film reduces, the surface morpholgy shape of the electrode may possibly deteriorate because strength is reduced in some cases. To reduce the possibility of surface morpholgy deterioration, the thickness of the Nb film may be equal 10 nm or more.

In the Example, the composition ratio of Al in the AlGaN film was set at 0.3; however it may be set as desired.

Furthermore, in the Example, the metal films were formed by sputtering deposition; however they may be stacked by the electron gun deposition method or the like.

Moreover, in the Example, the temperature of the heat treatment was set at 900° C.; however, any temperature may be used as the heat treatment temperature as long as it exceeds the melting point of Al. However, as the heat treatment temperature increases, the contact resistance tends to decrease. For this reason, the heat treatment may be performed at 800° C. or more.

When another metal film is newly stacked after the heat treatment, a metal film having a desired metal composition and thickness may be stacked in accordance with the purpose.

Example 2

FIG. 2 is a sectional view showing the structure of an electrode provided by this Example.

The electrode provided by the Example was formed by depositing an AlGaN film (composition ratio of Al: 0.3) as the GaN based semiconductor film 201, an Nb film (film thickness: 5 nm) as the intermediate metal film 202 formed of a metal having a melting point greater than the melting point of Al, an Al film 203 (film thickness: 70 nm) as the first metal film, and an Nb film (film thickness: 20 nm) as the second metal film 204 by the electron gun deposition method, performing patterning by a method such as lift-off, and thereafter, treating the resultant structure with heat at 850° C.

In such an electrode structure, since the surface of the Al film is covered with the Nb film, an electrode having a contact resistance as low as $5 \times 10^{-6}$ $\Omega cm^2$ or less can be obtained without reducing a coating ratio of the electrode material to the semiconductor film. At the same time, since the Nb film is rarely reacted with the Al film at 850° C., an extremely flat electrode surface can be obtained. It is possible to use an alignment mark for detecting a position by an optical sensor.

Note that, in this Example, the Nb film was used as the intermediate metal film 202 formed of a metal having a melting point greater than the melting point of Al; however, a metal film comprises at least one metal selected from the group consisting of Ti, Nb, V, W, Ta, Re, Mo, Mn, Pt, Pd, Rh, Y and Zr may be used in place of the Nb film.

Furthermore, the thickness of the Nb film was set at 5 nm; however, the thickness of the intermediate metal film 202 formed of a metal having a melting point greater than the melting point of Al may be set at the thickness as desired. However, if a metal capable of reacting with Al during the heat treatment is used, Al comprised in the first metal film 203 may be possibly all used up in the reaction with the intermediate metal film 202 comprising a metal having a melting point greater than the melting point of Al. To reduce such a possibility, the thickness of the intermediate metal film 202 formed of a metal having a melting point greater than the melting point of Al may be lowered than the thickness of the first metal film 203 formed of Al or an Al alloy.

Similarly, in the Example, an Al film was used as the first metal film 203; however, the first metal film may be a metal film comprises a mixture of Al and other metal(s). For example, Si or N may be added thereto. Note that as the content of Al decreases, the contact resistance tends to increase. Therefore, Al may be preferably used as a main component.

Furthermore, an Nb film was used as the second metal film 204. However, a metal film comprises at least one metal selected from the group consisting of Nb, W, Hf, Fe, Re, Ta and Zr may be used in place of the Nb film.

Also, in the Example, although the thickness of the Al film 203 was set at 70 nm and the thickness of the Nb film 204 was set at 20 nm; however, the thicknesses of the Al film and Nb film may be set as desired. Note that, as the thickness of the Nb film reduces, the surface morpholgy of the electrode may possibly deteriorate for strength reasons in some cases. To reduce such a possibility, the thickness of the Nb film may be set at 10 nm or more.

In the Example, the composition ratio of Al in the AlGaN film was set at 0.3; however it may be set as desired.

Furthermore, in the Example, the metal films were formed by the electron gun deposition method; however they may be stacked by a sputtering method or the like.

Moreover, in the Example, the temperature of the heat treatment was set at 850° C.; however, any temperature may be used as the heat treatment temperature as long as it exceeds the melting point of Al. However, as the heat treatment temperature increases, the contact resistance tends to decrease. For this reason, the heat treatment may be performed at 800° C. or more.

When another metal film is newly stacked after the heat treatment, a metal film having a desired metal composition and thickness may be stacked in accordance with the purpose.

Example 3

FIG. 3 is a sectional view showing the structure of an electrode provided by this Example.

The electrode provided by the Example was formed by depositing an AlGaN film (composition ratio of Al: 0.3) as the GaN based semiconductor film 301, an Al film (film thickness: 60 nm) as the first metal film 302, an Nb film (film thickness: 35 nm) as the second metal film 303, and an Au film (film thickness: 50 nm) as the third metal film 304 formed of a metal having a melting point greater than the melting point of Al by the electron gun deposition method, performing patterning by a method such as lift-off, and thereafter, treating the resultant structure with heat at 950° C.

In such an electrode structure, since the surface of the Al film is covered with the Nb film, an electrode having a contact resistance as low as $5 \times 10^{-6}$ $\Omega cm^2$ or less can be obtained without reducing a coating ratio of the electrode material to the semiconductor film. At the same time, since the Nb film is rarely reacted with the Al film at 950° C., an extremely flat electrode surface can be obtained. It is possible to use an alignment mark for detecting a position by an optical sensor.

Note that, in this Example, the Al film was used as the first metal film; however, the first metal film may be a metal film formed of a mixture of Al and other metal(s). For example, Si or N may be added thereto. Note that as the content of Al decreases, the contact resistance tends to increase. Therefore, Al may be preferably used as a main component.

Furthermore, an Nb film was used as the second metal film 303. However, a metal film comprises at least one metal selected from the group consisting of Nb, W, Fe, Hf, Fe, Re, Ta and Zr may be used in place of the Nb film. Also in the Example, although the thickness of the first metal film 302 formed of Al was set at 60 nm and the thickness of the second metal film 303 formed of Nb was set at 35 nm; however, the thicknesses of the Al film and Nb film may be set as desired. Note that, as the thickness of the Nb film reduces, the surface morpholgy of the electrode may possibly deteriorate for strength reasons in some cases. To reduce such a possibility, the thickness of the Nb film may be set at 10 nm or more.

In the Example, the composition ratio of Al in the AlGaN film was set at 0.3; however it may be set as desired.

Similarly, an Au film of 50 nm thick was used as the third metal film 304 formed of a metal having a melting point greater than the melting point of Al. However, the third metal film 304 formed of a metal having a melting point greater than the melting point of Al, in nature, does not directly contribute to the contact resistance between a semiconductor film and an electrode material and to the surface morpholgy.

For this reason, the third metal film 304 is not particularly required when the electrode material is not in direct contact with the exterior portion of the semiconductor device and the resistance working in a parallel direction of the surface of the electrode is not a matter of concern. In view of practical use in the semiconductor device, to protect the surface of the Nb film and to reduce the resistance working in a parallel direction of the electrode surface, a metal film comprises at least one metal selected from the group consisting of Cu, Ti, V, W, Ta, Re, Mo, Pt, Pd, Rh, Au and Zr may be used.

In the Example, the metal films were formed by the electron gun deposition method; however they may be stacked by a sputtering method or the like.

Furthermore, in the Example, the temperature of the heat treatment was set at 850° C.; however, any temperature may be used as the heat treatment temperature as long as it exceeds the melting point of Al. However, as the heat treatment temperature increases, the contact resistance tends to decrease. For this reason, the heat treatment may be performed at 800° C. or more.

When another metal film is newly stacked after the heat treatment, a metal film having a desired metal composition and thickness may be stacked in accordance with the purpose.

Example 4

FIG. 4 is a sectional view showing the structure of an electrode provided by this Example.

The electrode provided by the Example was formed by depositing an AlGaN film (composition ratio of Al: 0.3) as the GaN based semiconductor film 401, a Ti film (film thickness: 15 nm) as the intermediate metal film 402 formed of a metal having a melting point greater than the melting point of Al, an Al film (film thickness: 60 nm) as the first metal film 403, an Nb film (film thickness: 35 nm) as the second metal film 404, and an Au film (film thickness: 50 nm) as the third metal film 405 comprises a metal having a melting point greater than the melting point of Al by the electron gun deposition method, performing patterning by a method such as lift-off, and thereafter, treating the resultant structure with heat at 850° C.

In such an electrode structure, since the surface of the Al film is covered with the Nb film, an electrode having a contact resistance as low as $5 \times 10^{-6}$ $\Omega cm^2$ or less was obtained without reducing a coating ratio of the electrode material to the semiconductor film. At the same time, since the Nb film was rarely reacted with the Al film at 850° C., an extremely flat electrode surface was obtained. It was possible to use an alignment mark for detecting a position by an optical sensor.

FIG. 6 shows photographs taken by an optical microscope showing the surface of an electrode provided by the present invention in comparison with that of an electrode provided by conventional technology.

The electrode having a Ti/Al/Mo/Au structure according to a conventional technology is shown in the left side of FIG. 6 where rough convexo-concave portions were formed by the heat treatment performed at 850° C. for 30 seconds. On the other hand, the electrode having a Ti/Al/Nb/Au structure (second metal film formed of Nb having a melting point greater than the melting point Al and serving as a metal material hardly forming a eutectic alloy with Al even at a heat treatment temperature equal or greater than the melting point of Al) according to this Example is shown in the right side of FIG. 6 where the flat surface is maintained even by the heat treatment performed at 850° C. for 30 seconds.

In the semiconductor device having such an electrode, a flat electrode surface was formed. Therefore, a fine electrode pattern was manufactured with a good controllability, improving characteristics of a semiconductor device.

Note that, in this Example, the Ti film was used as the intermediate metal film 402 comprises a metal having a melting point greater than the melting point of Al; however, a metal film comprises at least one metal selected from the group consisting of Ti, Nb, V, W, Ta, Re, Mo, Mn, Pt, Pd, Rh, Y and Zr may be used in place of the Nb film.

Furthermore, the thickness of the Ti film was set at 15 nm; however, the thickness of the intermediate metal film 402 formed of a metal having a melting point greater than the melting point of Al may be set at the thickness as desired. However, if a metal capable of reacting with Al during the heat treatment is used, Al comprised in the first metal film 403 may be possibly all used up in the reaction with the intermediate metal film 402 formed of a metal having a melting point greater than the melting point of Al. To reduce such a possibility, the thickness of the intermediate metal film 402 formed of a metal having a melting point greater than the melting point of Al may be lowered than the thickness of the first metal film 403 formed of Al or an Al alloy.

In the Example, the composition ratio of Al in the AlGaN film was set at 0.3; however it may be set as desired.

Similarly, in this Example, an Al film was used as the first metal film 403; however, the first metal film may be a metal film formed of a mixture of Al and other metal(s). For example, Si or N may be added thereto. Note that as the content of Al decreases, the contact resistance tends to increase. Therefore, Al may be preferably used as a main component.

Furthermore, an Nb film was used as the second metal film 404. However, a metal film comprises at least one metal selected from the group consisting of Nb, W, Hf, Fe, Re, Ta and Zr may be used in place of the Nb film.

Also in the Example, although the thickness of the first metal film 403 formed of Al was set at 60 nm and the thickness of the second metal film 404 formed of Nb was set at 35 nm; however, the thicknesses of the Al film and Nb film may be set as desired. Note that, as the thickness of the Nb film reduces, the surface morpholgy of the electrode may possibly deteriorate for strength reasons in some cases. To reduce such a possibility, the thickness of the Nb film may be set at 10 nm or more.

Also, an Au film of 50 nm thick was used as the third metal film 405 formed of a metal having a melting point greater than the melting point of Al. However, the third metal film 405 formed of a metal having a melting point greater than the melting point of Al, in nature, does not directly contribute to the contact resistance between a semiconductor and a metal and to the surface morpholgy.

For this reason, the third metal film is not particularly required when the metal is not in direct contact with the exterior portion of the semiconductor device and the resistance working in a parallel direction of the surface of the electrode is not a matter of concern. In view of practical use in the semiconductor device, to protect the surface of the Nb film and to reduce the resistance working in a parallel direction of the electrode surface, a metal film comprises at least one metal selected from the group consisting of Cu, Ti, V, W, Ta, Re, Mo, Pt, Pd, Rh, Au and Zr may be used.

In the Example, the metal films were formed by the electron gun deposition method; however they may be stacked by a sputtering method or the like.

Furthermore, in the Example, the temperature of the heat treatment was set at 850° C.; however, any temperature may be used as the heat treatment temperature as long as it exceeds the melting point of Al. However, as the heat treatment temperature increases, the contact resistance tends to decrease. For this reason, the heat treatment may be performed at 800° C. or more.

When another metal film is newly stacked after the heat treatment, a metal film having a desired metal composition and thickness may be stacked in accordance with the purpose.

Example 5

FIG. 5 is a sectional view showing the structure of an electrode provided by this Example.

The semiconductor device provided by this Example is a field-effect transistor.

The field-effect transistor has a structure formed by stacking an AlN buffer layer 502 (film thickness: 100 nm), a GaN carrier migration layer 503 (film thickness: 2 μm), and an AlGaN carrier supply layer 504 (composition ratio of Al: 0.3, film thickness: 30 nm) sequentially in this order on a SiC substrate 501 by a vapor deposition method using organic materials. On the AlGaN carrier supply layer 504, the source electrode 505, the drain electrode 506 and the gate electrode 507 different in structure from the electrodes are provided.

To form the source electrode 505 and the drain electrode 506, the AlGaN carrier supply layer 504 is covered with photoresist and the photoresist corresponding to a portion at which the source electrode 505 and the drain electrode 506 are to be placed; at the same time, a portion to which an alignment mark based on which another metal are provided, is exposed to light by use of a light exposure device such as a stepper to remove the photoresist.

Subsequently, an Nb film (film thickness; 7 nm) as the intermediate metal film 402 formed of a metal having a melting point greater than the melting point of Al, an Al film (film thickness; 65 nm) as the first metal film 403, an Nb film (film thickness: 35 nm) as the second metal film 404, and an Au film (film thickness; 50 nm) as the third metal film 405 having a melting point greater than the melting point of Al are sequentially stacked by the electron gun deposition method, and patterning is performed by a method such as lift-off, followed by treating with heat at 900° C. to form the source electrode 505 and the drain electrode 506.

In the aforementioned step, an alignment mark for arranging another metal is simultaneously formed. Thereafter, the resultant structure is covered again with a photoresist and exposed to light such as electron beam by use of a light-emitting device. In this manner, a predetermined part of photoresist corresponding to the portion of the gate electrode 507 is exposed to light based on the alignment mark as a reference to remove the photoresist.

Subsequently, as the gate electrode 507, for example, an Ni film (film thickness; 15 nm) and an Au film (film thickness: 300 nm) are sequentially stacked by the electron gun deposition method, and unnecessary metal is removed by a method such as lift-off, to form the gate electrode 507. As a result, the field-effect transistor is obtained.

In such an electrode structure, since the surface of the Al film is covered with the Nb film, an electrode having a contact resistance as low as $5 \times 10^{-6}$ $\Omega cm^2$ or less can be obtained without reducing a coating ratio of the electrode material to the semiconductor film.

At the same time, since the Nb film is rarely reacted with the Al film at 900° C., an extremely flat electrode surface can be obtained. It is possible to use an alignment mark for detecting a position by an optical sensor. Since the gate electrode can be arranged based on the alignment mark as a reference, a fine field-effect transistor having a narrow interval between the source electrode and the drain electrode can be formed. In addition, since a step of forming an alignment mark is not performed, a period required for manufacturing a field-effect transistor or the number of steps can be reduced.

Note that, in this Example, the aforementioned structure is shown as an example for a crystal structure for use in a field-effect transistor. Any crystal structure may be used as the crystal structure for use in a field effect transistor in accordance with the purpose.

Note that, in this Example, the Nb film was used as the intermediate metal film 402 comprises a metal having a melting point greater than the melting point of Al; however, a metal film comprises at least one metal selected from the group consisting of Ti, Nb, V, W, Ta, Re, Mo, Mn, Pt, Pd, Rh, Y and Zr may be used in place of the Nb film.

Furthermore, the thickness of the Nb film was set at 7 nm; however, the thickness of the intermediate metal film 402 comprises a metal having a melting point greater than the melting point of Al may be set at the thickness as desired.

In the Example, the composition ratio of Al in the AlGaN film was set at 0.3; however it may be set as desired.

However, if a metal capable of reacting with Al during the heat treatment is used, Al contained in the first metal film 403 may be possibly all used up in the reaction with the intermediate metal film 402 formed of a metal having a melting point greater than the melting point of Al. To reduce such a possibility, the thickness of the intermediate metal film 402 formed of a metal having a melting point greater than the melting point of Al may be lowered than the thickness of the first metal film 403 formed of Al or an Al alloy.

Similarly, in the Example, an Al film was used as the first metal film 403; however, the first metal film 403 may be a metal film formed of a mixture of Al and other metal(s) or Si and N may be added thereto. Note that as the content of Al decreases, the contact resistance tends to increase. Therefore, Al may be preferably used as a main component.

Furthermore, an Nb film was used as the second metal film 404. However, a metal film comprises at least one metal selected from the group consisting of Nb, W, Fe, Hf, Re, Ta and Zr may be used in place of the Nb film.

Also in the Example, although the thickness of the first metal film 403 comprises Al was set at 65 nm and the thickness of the second metal film 404 comprises Nb was set at 35 nm; however, the thicknesses of the Al film and Nb film may be set as desired. Note that, as the thickness of the Nb film reduces, the surface morpholgy of the electrode may possibly deteriorate for strength reasons in some cases. Therefore, the thickness of the Nb film may be set at 10 nm or more.

Similarly, an Au film of 50 nm thick was used as the third metal film 405 formed of a metal having a melting point greater than the melting point of Al. However, the third metal film 405 formed of a metal having a melting point greater than the melting point of Al, in itself, does not directly contribute to the contact resistance between a semiconductor and a metal and to the surface morpholgy.

For this reason, the third metal film 405 is not particularly required when the metal is not in direct contact with the exterior portion of the semiconductor device and the resistance working in a parallel direction of the surface of the electrode is not a matter of concern. In view of practical use in the semiconductor device, to protect the surface of the Nb film and to reduce the resistance working in a parallel direction of the electrode surface, a metal film comprises at least one metal selected from the group consisting of Cu, Ti, V, W, Ta, Re, Mo, Pt, Pd, Rh, Au and Zr may be used.

In the Example, the metal films were formed by the electron gun deposition method; however they may be stacked by a sputtering method or the like.

Furthermore, in the Example, the temperature of the heat treatment was set at 850° C.; however, any temperature may be used as the heat treatment temperature as long as it exceeds the melting point of Al. However, as the heat treatment temperature increases, the contact resistance tends to decrease. For this reason, the heat treatment may be performed at equal 800° C. or more.

When another metal film is newly stacked after the heat treatment, a metal film having a desired metal composition and thickness may be stacked in accordance with the purpose.

In the foregoing, the present invention has been described with reference to Examples. Those skilled in the art would understand that the Examples are provided simply for illustration, and various modifications are possible within the scope of the present invention.

In the Examples mentioned above, a field effect transistor was used as an example of a semiconductor device. A semiconductor device using a Group III nitride semiconductor film may be used. Of them, a light emitting diode, laser diode, Schottky diode, and bipolar transistor may be used. In these semiconductor devices, it has been strongly desired to reduce the number of manufacturing steps and form a fine pattern formation with a high accuracy. Such an effect can be obtained by use of the present invention.

The invention claimed is:

1. An electrode comprising:
    at least a first metal layer and a second metal layer sequentially formed on a semiconductor film in this order, and
    an intermediate metal layer interposed between the first metal layer and the semiconductor film, wherein
    the electrode is in ohmic contact with the semiconductor film with heat treatment at a temperature that is higher than a melting point of Al by 40° C. or more,
    the semiconductor film is formed on a substrate,
    the first metal layer is formed with a first metal material,
    the second metal layer is formed with a second metal material,
    the intermediate metal layer comprises a metal material having a melting point greater than the melting point of Al,
    an eutectic alloy formed of the first metal material and a second metal material forming the second metal layer has a melting point equal to or higher than the temperature of the heat treatment,
    an alloy of the second metal material and Al starts to be formed at a temperature equal to or higher than the melting point of Al,
    the first metal material is comprised of Al; and
    the second metal material comprises at least one metal selected from the group consisting of Nb, Fe, Re, Ta and Zr.

2. The electrode according to claim 1, wherein the alloy of the second metal material and Al starts to be formed at a temperature equal to or greater than the temperature of the heat treatment.

3. The electrode according to claim 1, wherein the temperature of the heat treatment is equal to or greater than 800° C.

4. The electrode according to claim 1, wherein the melting point of the euteetic alloy is equal to or greater than 1,100° C.

5. The electrode according to claim 1, wherein the second metal material forming the second metal layer is composed of a metal selected from the group consisting of Nb, W, Fe, Hf, Re, Ta and Zr.

6. The electrode according to claim 1, wherein a third metal layer is interposed between the first metal layer and the second metal layer.

7. The electrode according to claim 6, wherein the third metal layer comprises an alloy formed of the first metal material and the second metal material.

8. The electrode according to claim 1, wherein the semiconductor film is a Group III nitride semiconductor film.

9. The electrode according to claim 1, wherein part or whole of the first metal layer comprises an alloy formed of the first metal material and the metal material constituting the intermediate metal layer.

10. The electrode according to claim 1, wherein the metal material constituting the intermediate metal layer comprises at least one metal selected from the group consisting of Nb, V, W, Ta, Re, Mo, Mn, Pt, Pd, Rh, Y and Zr.

11. The electrode according to claim 1, wherein a third metal layer comprising a third metal material having a melting point greater than the melting point of Al is further provided on the second metal layer.

12. The electrode according to claim 11, wherein the second metal material comprises of Nb and the third metal material is formed of Au.

13. A semiconductor device comprising a semiconductor film and an electrode formed on the semiconductor film, wherein the electrode is the electrode according to claim 1.

14. A method for manufacturing an electrode formed on a semiconductor film comprising:
    forming a first metal film on the semiconductor film;
    forming a second metal film on the first metal film; and
    treating the first metal film and the second metal film with heat at a temperature that is higher than than the melting point of Al by 40° C. or more,
    wherein
    the first metal layer is formed with a first metal material,
    the second metal layer is formed with a second metal material,
    an eutectic alloy formed of the first metal film and the second metal film has a melting point equal to or higher than the temperature of the heat treatment, an alloy of the second metal material and Al starts to be formed at a temperature equal to or greater than the melting point of Al,
    the first metal material is comprised of Al; and
    the second metal material comprises at least one metal selected from the group consisting of Nb, Fe, Re, Ta, and Zr.

15. The method for manufacturing an electrode according to claim 14, wherein the alloy of the second metal material and Al starts to be formed at a temperature equal to or greater than the temperature of the heat treatment.

* * * * *